United States Patent [19]
Yin

[11] Patent Number: 5,889,656
[45] Date of Patent: Mar. 30, 1999

[54] PIVOTAL DEVICE FOR RETAINING AN ADD-ON MODULE ON A MOTHER BOARD

[75] Inventor: Ji-Zhong Yin, Fremont, Calif.

[73] Assignee: Micronics Computers Inc., Fremont, Calif.

[21] Appl. No.: 862,656

[22] Filed: May 23, 1997

[51] Int. Cl.$^6$ .......................... H05K 7/12; H01R 13/629
[52] U.S. Cl. ....................... 361/801; 361/740; 361/759; 439/64; 439/377
[58] Field of Search ................................... 361/732, 740, 361/741, 747, 756, 759, 788, 801, 802; 439/64, 157, 160, 327, 328, 377, 630

[56] References Cited

U.S. PATENT DOCUMENTS 3,932,016  1/1976  Ammenheuser ......................... 439/377
4,080,031  3/1978  Sawford-Atkins ...................... 439/377

*Primary Examiner*—Gerald P. Tolin
*Assistant Examiner*—John B. Vigushin
*Attorney, Agent, or Firm*—Paul Hentzel

[57] ABSTRACT

Computer apparatus 10 receives add-on electronic module 12 for installation into the computer apparatus. The add-on module has first end 12A and second end 12B with electrical contacts 12C therebetween for interfacing with the computer apparatus. Elongated electrical connector 14 mounted on the mother board, has first end 14A and second end 14B corresponding to the first end and second end of the add-on module. The electrical connector defines a module site within the computer apparatus for receiving the add-on module. The electrical connector has electrical contacts 14C between the ends thereof for electrically contacting corresponding electrical contacts 12C on the add-on module. First pivot base 16A secured to the mother board proximate the first end of the electrical connector defines first pivot axis 17A. Second pivot base 16B proximate the second end of the electrical connector defines second pivot axis 17B. First retaining arm 18A pivotally engages the first pivot base for pivoting about the first pivot axis to retain the first end of the add-on module. Second retaining arm 18B engages the second pivot base for pivoting about the second pivot axis to retain the second end of the add-on module. This pivotal engagement provides three positions of the retaining arm with respect to the pivot base, a folded storage position, an open receiving pivot position, and an unfolded retaining position.

23 Claims, 3 Drawing Sheets

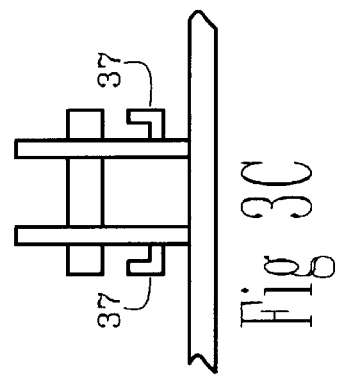
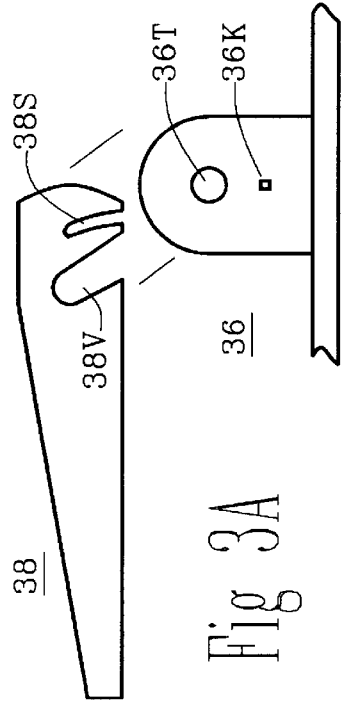
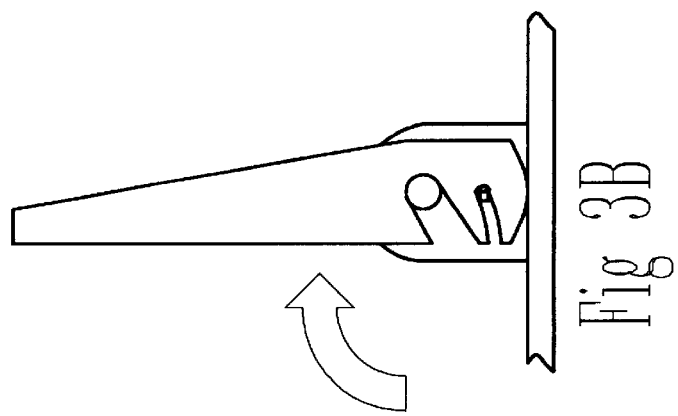
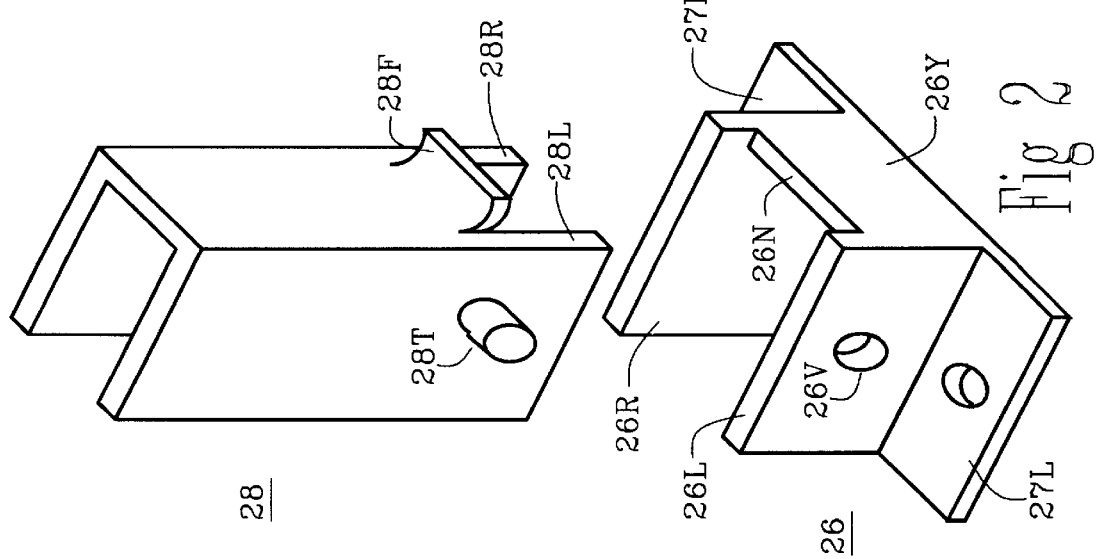

PIVOTAL DEVICE FOR RETAINING AN ADD-ON MODULE ON A MOTHER BOARD

TECHNICAL FIELD

This invention relates to devices secured to a mother board for an add-on module, and more particularly to such devices with pivoting retaining arms having a folded storage position and an unfolded retaining position.

BACKGROUND

Heretofore add-on modules were small and light, and did not require mechanical support beyond simply plugging then into an electrical connector. Many add-on chips were flat mounted directly on the mother board. However, state-of-the-art chips have a greater transistor density and a faster cycle rate, and therefore generate more internal heat. These "hot" chips are typically contained within an add-on module vertically mounted on the mother board between vertical posts forming a rigid upright support frame. The vertical arrangement reduced the footprint of the add-on module on the mother board, and exposed both sides of the add-on module to convective cooling air flow. A massive heat sink with cooling fins extending from the add-on module was employed to remove the internal heat. The cooling fins extended to one side creating an "offset" load on the support frame which was transferred to the mother board. The vertical posts of the support frame created a high shipping profile for the mother board. This shipping profile was much higher than the flat profile of a mother board without support posts, resulting in increased shipping volume and increased shipping costs.

SUMMARY

It is therefore an object of this invention to provide a pair of retaining arms mounted on a mother board having a folded position close to the mother board and an unfolded position away from the mother board.

It is another object of this invention to provide such retaining arms which pivotally engage the mother board to provide the folded and unfolded positions.

It is a further object of this invention to provide such a pivotal engagement which is resilient to permit engagement and disengagement.

It is a further object of this invention to provide such retaining arms which may be engaged and disengaged while in the folded position.

It is a further object of this invention to provide such retaining arms which lock into pivotal engagement in the unfolded position.

It is a further object of this invention to provide such retaining arms which pivot into an open position for receiving the add-on module.

It is a further object of this invention to provide such retaining arms having detents defining the pivot positions thereof.

Briefly, these and other objects of the present invention are accomplished by providing a computer apparatus for receiving an add-on electronic module to be installed in the computer apparatus. The add-on module has a first end and a second end and electrical contacts therebetween for interfacing with the computer apparatus. A mother board supports the components of the computer apparatus including an add-on module. An elongated electrical connector mounted on the mother board, has a first end and a second end corresponding to the first end and second end of the add-on module defining a module site for receiving the add-on module. The electrical connector has electrical contacts between the ends thereof for electrically contacting corresponding electrical contacts on the add-on module. A first pivot base is secured to the mother board proximate the first end of the electrical connector defining a first pivot axis. A second pivot base is secured to the mother board proximate the second end of the electrical connector defining a second pivot axis. A first retaining arm pivotally engages the first pivot base for pivoting about the first pivot axis to retain the first end of the add-on module. A second retaining arm pivotally engages the second pivot base for pivoting about the second pivot axis to retain the second end of the add-on module. The pivotal engagement provides a folded storage pivot position in which the retaining arms are folded close to the mother board for providing a low height profile to accommodate storage of the computer apparatus before the add-on module has been received into the module site. The pivotal engagement also provides an unfolded retaining pivot position in which the retaining arms are unfolded away from the mother board for mechanically retaining the first and second ends of the add-on module after the add-on module has been received into the module site.

BRIEF DESCRIPTION OF THE DRAWING

Further objects and advantages of the present retaining device and the operation of the pivoting retaining arms will become apparent from the following detailed description and drawing (not drawn to scale) in which:

FIG. 2 is an exploded perspective view of a single retaining arm pivotally engaging a pivot base;

FIG. 3A is a front view showing a retaining arm almost in the folded position about to engage a pivot base;

FIG. 3B is a front view showing a retaining arm in the unfolded position locked into engagement with a pivot base;

FIG. 3C is an inside end view of a pivot base without retaining arms;

Figure 1:
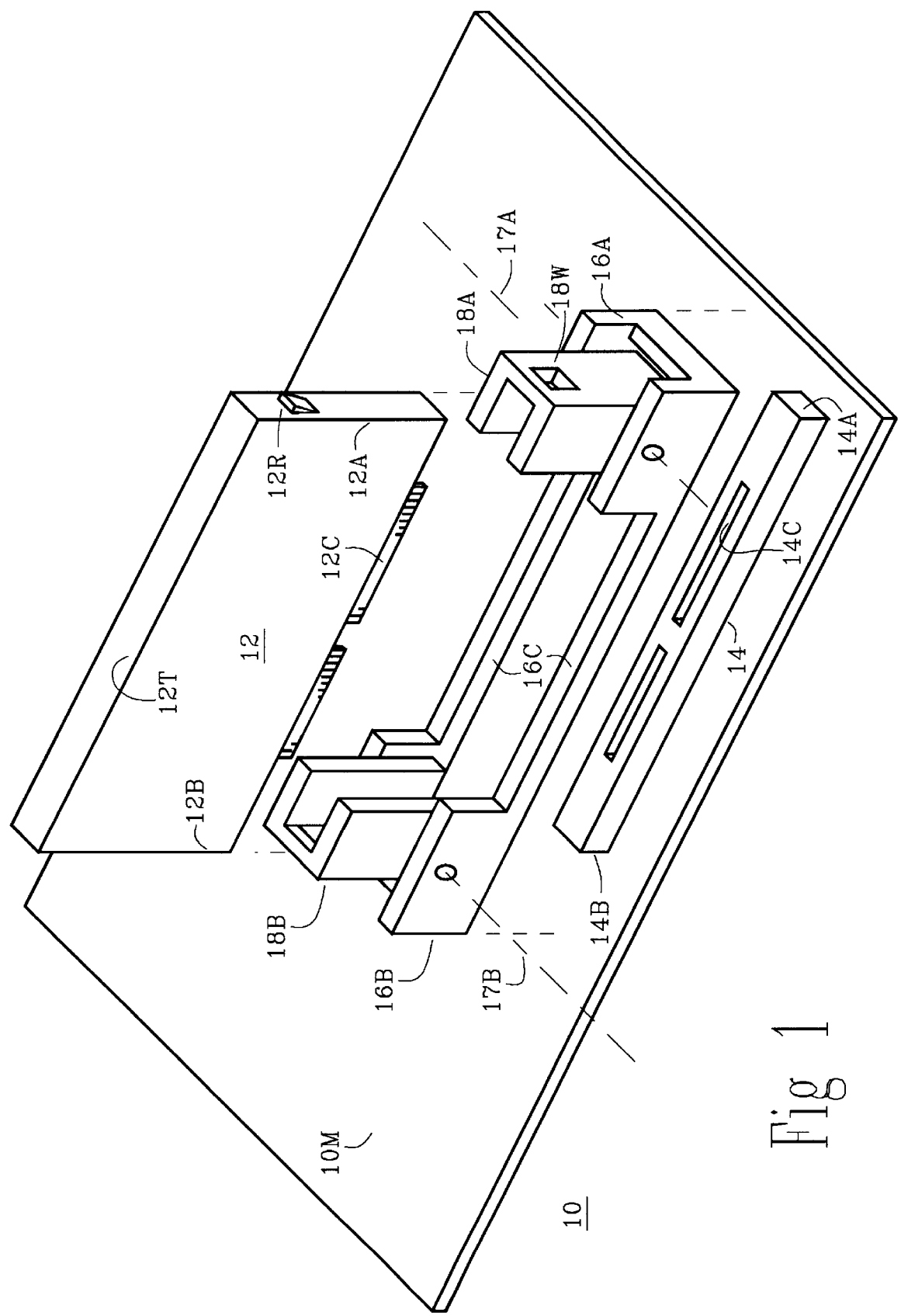
FIG. 1 is a perspective view of a computer apparatus showing a pivotal retaining device and an add-on module in exploded format.

The first digit of each reference numeral in the above figures indicates the figure in which that element is most prominently shown. The second digit indicates related structural elements, and a final letter (when used) indicates a sub-portion of an element.

GENERAL EMBODIMENT—FIG. 1

Computer apparatus 10 receives add-on electronic module 12 for installation into the computer apparatus. The add-on module may be a processor contained within a mounting cartridge, and include a CPU chip with peripheral circuitry. The add-on module has first end 12A and second end 12B with electrical contacts 12C therebetween for interfacing with the computer apparatus. Mother board 10M supports the components of the computer apparatus including the add-on module. Elongated electrical connector 14 mounted on the mother board, has first end 14A and second end 14B corresponding to the first end and second end of the add-on module. The electrical connector defines a module site within the computer apparatus for receiving the add-on module. The electrical connector has electrical contacts 14C between the ends thereof for electrically contacting corresponding electrical contacts 12C on the add-on module.

First pivot base 16A secured to the mother board proximate the first end of the electrical connector defines first pivot axis 17A. Second pivot base 16B proximate the second end of the electrical connector defines second pivot axis 17B. First retaining arm 18A pivotally engages the first pivot base for pivoting about the first pivot axis to retain the first end of the add-on module. Second retaining arm 18B engages the second pivot base for pivoting about the second pivot axis to retain the second end of the add-on module. In the embodiment of FIG. 1, the retaining arms wrap-around the ends of add-on module 12 to hold top 12T of the module in place. The end and top of each pivot base are open for receiving the retaining arm and for accommodating the pivoting action.

Figure 4A:
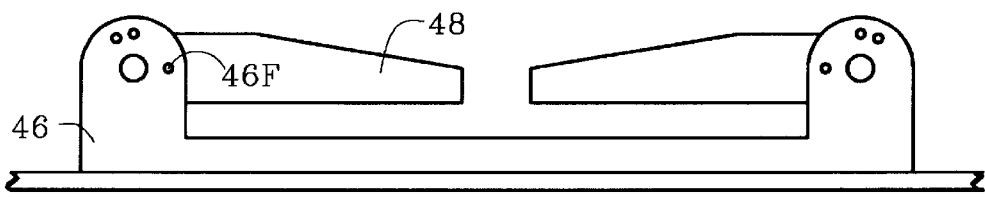
FIG. 4A is a front view showing a pair of retaining arms and pivot bases secured to a mother board in the folded position for storage.
Figure 4B:
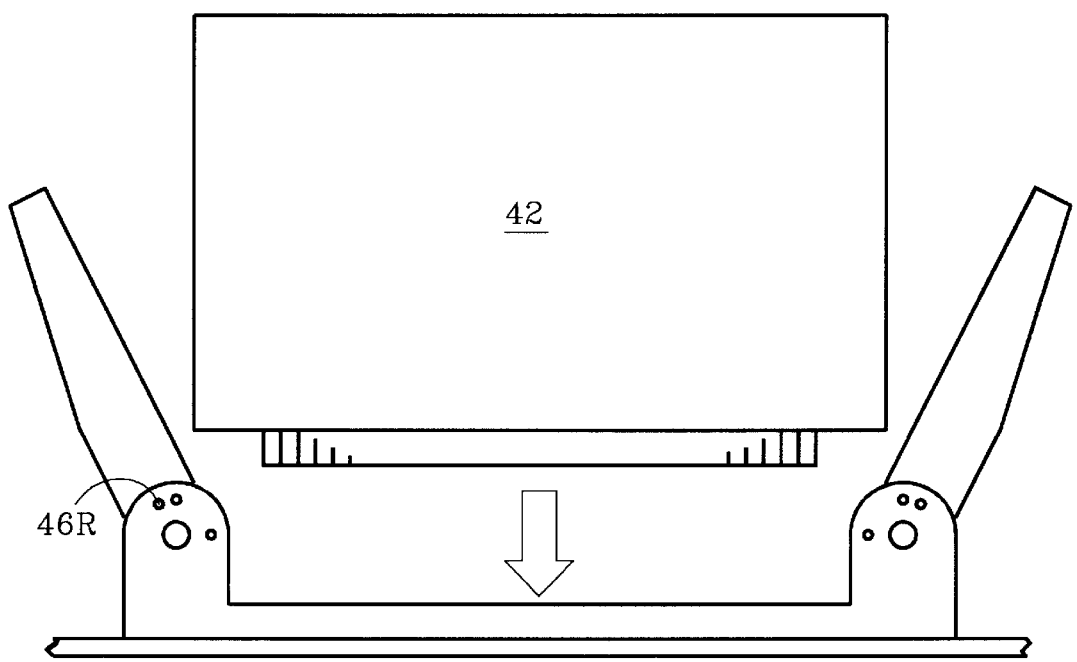
FIG. 4B is a front view showing the retaining arms and pivot bases of FIG. 4A in an open position for receiving an add-on module.
Figure 4C:
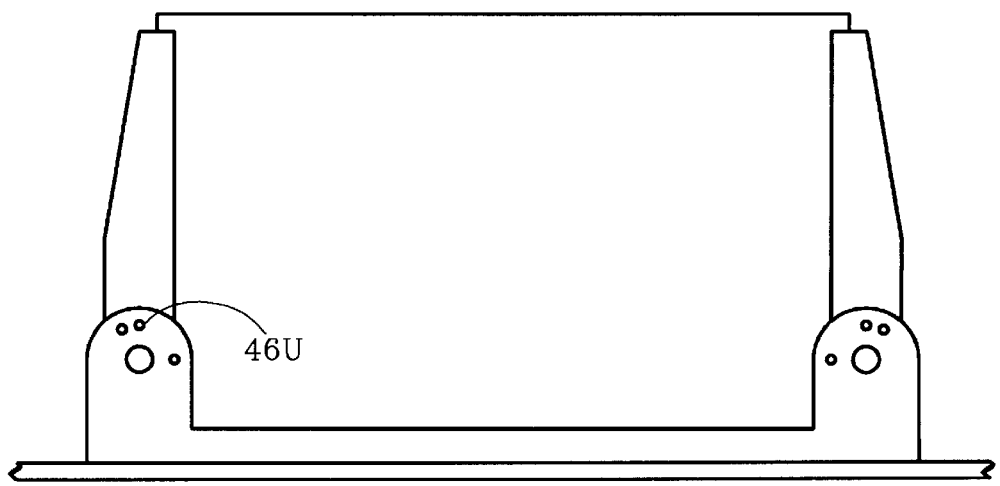
FIG. 4C is a front view showing the retaining arms and pivot bases of FIG. 4B in the unfolded position retaining the add-on module.

This pivotal engagement provides three positions of the retaining arm with respect to the pivot base:

A) a folded storage position with a low height profile for shipping (as shown in FIG. 4A),
B) an open receiving pivot position for permitting installation of the add-on module (as shown in FIG. 4B), and
C) an unfolded retaining position for mechanically retaining the add-on module (as shown in FIG. 4C).

The pivoting operation of the retaining arms and position detents are described hereinafter in section POSITION DETENTS in connection with FIG. 4.

A suitable catch structure on each retaining arm such as window 18W (see FIG. 1), cooperates with a corresponding catch structure such as spring loaded ramp cam 12R at each end of the add-on module. During installation of the add-on module, the ramp cams are pressed inward permitting the add-on module to pass between the vertical retaining arms. When the add-on module is positioned within the module site and electrical contacts 12C engage contacts 14C, each ramp cam "pops" out and catches against the top edge of the corresponding window. To remove the add-on module, both ramp cams are simultaneously pressed freeing the cam from the window.

Elongated center base 16C extends between the first pivot base and the second pivot base along the elongated electrical connector. The center base connects the two pivot bases to form a sturdy single base member. The single base member may be part of the mother board electrical connector 14. The base and connector may be integrally formed in a one piece assembly, or fastened together in place. Uniting the base with the connector minimizes internal compressive stress on the adjacent mother board region and on the conductive traces to the electrical connector.

VOID AND TRUNNION EMBODIMENT—FIG. 2

The pivotal engagement between retaining arm 28 and pivot base 26 may be a first void and trunnion structure. The void and trunnion structures are formed on adjacent regions of the retaining arms and the pivot bases for pivotally engaging the retaining arms with the pivot bases. The void and trunnion engagement may be formed by a suitable void such as bore 26V in the pivot base, and a suitable trunnion such as stub 28T extending from the retaining arm engaging the bore. In an alternative embodiment, the void may be in the pivot base and the trunnion may extend from the retaining arm.

Each retaining arm may have a left leg 28L and a right leg 28R which nest within the pivot base (as shown in FIG. 2). The void and trunnion structure has a left void and trunnion between the pivot base and the left leg of each retaining arm, and a right void and trunnion between the pivot base and the right leg of each retaining arm. These void and trunnion pairs define the pivot axes in a direction lateral to the elongated electrical connector, and preferably parallel to the mother board.

The pivot base may be formed by a left leg 26L and a right leg 26R and a yoke 26Y at one end of the pivot base connecting the legs. The left leg may have stabilizing left foot 27L extending therefrom for securing the pivot base to the mother board. The right leg may have a similar stabilizing right foot 27R. The feet extend laterally with respect to the mother board electrical connector from either side of the pivot base for stabilizing the pivot base and the retaining arm engaging the pivot base, and also the add-on module installed in the electrical connector retained by the retaining arms. This lateral stabilization prevents the module from tilting about the long dimension of the electrical connector. Short dimension stabilization is provided by the length of the electrical connector and the add-on module.

The retaining arm may be sufficiently resilient to permit the voids of the void and trunnion structure to snap over the trunnions for engaging with and disengaging from the trunnion. Alternatively, the pivot base may be formed of a resilient material which permits the legs to displace sufficiently by coming together (or spreading apart) to receive the retaining arm. The leg displacement may be best accomplished when at least one foot is not secured to the mother board. The void and trunnion pivotal structure then engages, capturing the retaining arm onto the pivot base. The capture is completed when both feet are secured to the mother board and the legs can no longer be displaced.

A resilient interface between the retaining arms in the unfolded position and the pivot bases, provides a slight folding force which urges the retaining arms against each end of the add-on module after the add-on module is installed. The interface may be formed by a suitable resilient structure on the retaining arm such as flange 28F and a suitable stop structure on the pivot base such as niche 26N. The flange and niche are spaced when the retaining arm is down in the folded position, and close just as the retaining arm approaches the unfolded vertical position. As the add-on module is installed into the module site flange 28T closes against niche 26N. The retaining arm is displaced slightly further into the unfolded position pressing the flange firmly into the niche. This closure displacement causes the flange to bend slightly, maintaining a slight return folding force of the retaining arm against the add-on module for the duration of the add-on module installation in the module site. In an alternate embodiment, the resilient flange may be part of the pivot base and the niche may be formed in the retaining arm.

LOCKING EMBODIMENT—FIGS. 3A 3B and 3C

The void and trunnion structure shown in the embodiment of FIG. 3 permits retaining arm 38 to engage with and disengage from pivot base 36 when the retaining arm is in the folded position (as shown in FIG. 3A). The void of the void and trunnion structure is open notch 38V for engaging with and disengaging from trunnion 36T. Before the add-on module has been installed, the module site is vacant and offers space for positioning the retaining arms. The retaining arm is placed in the module site proximate the pivot base permitting the open notch to engage the trunnion.

A locking structure between the retaining arms and the pivot bases, prevents the disengagement of the retaining arms from the pivot bases when the retaining arms are in the unfolded position (as shown in FIG. 3B). Locking knobs 36K extends laterally from each pivot base. Corresponding locking slots 38S formed in each retaining arm lock with the locking knob as the retaining arm pivots from the folded position to the unfolded position. Preferably each retaining arm has a left leg with a left locking slot for locking with a left knob on the pivot base, and a right leg with a right locking slot for locking with a right knob. In the embodiment of FIG. 3, the left and right legs straddle the outside of the pivot base.

The locking structure prevents upward movement and removal of the retaining arm. The locking slot may have a wide mouth for centering with the locking knob as the retaining arm is pivoted upward. Camming action between the lower edge of the locking slot and the locking knob settles the trunnion to a solid bottom position at the top of open notch 38V. The open notch may have a slight upward pitch to facilitate the arm/base lock.

Terminal ears may be employed to prevent lateral displacement of the retaining arm legs while the retaining arms are in the unfolded position (as shown in FIG. 3C). Left and right terminal ears 37 are positioned on the ends of left and right locking knobs 36K. The ears keep the legs close to the pivot base preventing the trunnions from slipping out of the voids.

POSITION DETENTS—FIGS. 4A 4B and 4C

The folded storage pivot position is shown in FIG. 4A. The retaining arms are pivoted about the pivot axes and folded close to the mother board for providing a compact, low height profile to accommodate storage or shipment of the computer apparatus before the add-on module has been installed into the module site. Suitable placement mechanisms such as fold detents 46F between each pivot base 46 and each retaining arm 48 may be provided to hold the retaining arms in the folded position. The fold detents may be opposed indent/extend pairs formed on adjacent regions of the retaining arms and the pivot bases, which mesh together when the retaining arm is in the folded position defining the folded position. In the embodiment of FIG. 4A, the folded position of the retaining arms is inward into the module site between the first and second ends of the electrical connector. In the absence of the add-on module, the module site is available for storing the retaining arms in the folded position. In an alternative embodiment, the retaining arms may fold outward over the surrounding regions of the mother board.

The open receiving pivot position is shown in FIG. 4B. The retaining arms are pivoted about the pivot axes and displaced away from the module site beyond the unfolded position for providing access to the mother board electrical connector as add-on module 42 is received. Suitable receiving placement mechanisms such as limit structures or receiving detents 46R between each pivot base 46 and each retaining arm 48 may be provided to limit or define the away displacement of the open receiving position. The receiving detents may also be opposed indent/extend pairs which mesh together to hold the retaining arms in the open receiving position. The receiving detents prevent the retaining arms from flopping downward into the module site during installation and interfering with the alignment between module electrical contacts and the mother board electrical contacts.

The unfolded retaining pivot position is shown in FIG. 4C. The retaining arms are pivoted about the pivot axes away from the mother board for mechanically retaining the first and second ends of add-on module 42 after add-on module 42 has been received into the module site. The unfolded position of the retaining arms is away from the mother board out of the module site in a generally upright posture. Suitable placement mechanisms such as unfold detents 46U between each pivot base 46 and each retaining arm 48 may be provided to hold the retaining arms in the unfolded position. The unfold detents may also be opposed indent/extend pairs which mesh together defining the folded position.

INDUSTRIAL APPLICABILITY

It will be apparent to those skilled in the art that the objects of this invention have been achieved as described hereinbefore. Clearly various changes may be made in the structure and embodiments shown herein without departing from the concept of the invention. Further, features of the embodiments shown in the various figures may be employed with the embodiments of the other figures.

Therefore, the scope of the invention is to be determined by the terminology of the following claims and the legal equivalents thereof.

I claim as my invention:

1. Computer apparatus for receiving an add-on electronic module to be installed in the computer apparatus, which add-on module has a first end and a second end and electrical contacts therebetween for interfacing with the computer apparatus, comprising:

a mother board for supporting components of the computer apparatus including an add-on module;

an elongated electrical connector mounted on the mother board, and having a first end and a second end corresponding to the first end and second end of the add-on module defining a module site for receiving the add-on module, the electrical connector having electrical contacts between the ends thereof for electrically contacting corresponding electrical contacts on the add-on module;

a first pivot base secured to the mother board proximate the first end of the electrical connector, and defining a first pivot axis;

a second pivot base secured to the mother board proximate the second end of the electrical connector, and defining a second pivot axis;

an elongated center base extending between the first pivot base and the second pivot base along the elongated electrical connector, forming a single base member with the first and second pivot bases;

a first retaining arm pivotally engaging the first pivot base for pivoting about the first pivot axis to retain the first end of the add-on module;

a second retaining arm pivotally engaging the second pivot base for pivoting about the second pivot axis to retain the second end of the add-on module;

the pivotal engagement providing a folded storage pivot position in which the retaining arms are folded close to the mother board for providing a low height profile to accommodate storage of the computer apparatus before the add-on module has been received into the module site, and an unfolded retaining pivot position in which the retaining arms are unfolded away from the mother board for mechanically retaining the first and second ends of the add-on module after the add-on module has been received into the module site.

2. The computer apparatus of claim 1, further comprising:
catch means on each retaining arm for catching the add-on module within the module site after the add-on module has been installed.

3. The computer apparatus of claim 1, wherein the single base member is part of the electrical connector.

4. The computer apparatus of claim 1, further comprising:
a first resilient interface between the first retaining arm and the first pivot base, and
a second resilient interface between the second retaining arm and the second pivot base,
which resilient interfaces are open when the retaining arms are in the folded position and which close just as the retaining arms approach the unfolded position,
the closure of the resilient interfaces causing the retaining arms to be displaced slightly further into the unfolded position by the add-on module during installation, to provide a slight folding force which urges the retaining arms against the add-on module after add-on module is installed.

5. The computer apparatus of claim 1, wherein each pivot base further comprises:
a foot means extending laterally from the pivot base with respect to the elongated electrical connector for stabilizing the pivot base and the retaining arm engaging the pivot base and the add-on module installed in the electrical connector retained by the retaining arms.

6. The computer apparatus of claim 1, wherein
the pivotal engagement between the first retaining arm and the first pivot base is a first void and trunnion structure, and
the pivotal engagement between the second retaining arm and the second pivot base is a second void and trunnion structure,
the void and trunnion structures are formed on adjacent regions of the retaining arms and the pivot bases for pivoting the retaining arms about the pivot bases and for defining the first pivot axis and the second pivot axis in a direction lateral to the elongated electrical connector.

7. The computer apparatus of claim 6, wherein
each pivot base is formed by a left leg and a right leg and a yoke portion at one end of the pivot base connecting the legs with the other end of the pivot base open for receiving the retaining arm;
the left leg having a left foot extending therefrom and the right leg having a right foot extending therefrom for securing the pivot base to the mother board;
each pivot base formed of a resilient material which permits the legs to displace sufficiently when at least one foot is not secured to the mother board to receive the retaining arm engaging the void and trunnion pivotal structure which captures the retaining arm, and which locks the retaining arm to the legs when both feet are secured to the mother board.

8. The computer apparatus of claim 6, wherein:
the void and trunnion structure permits the retaining arms to engage with and disengage from the pivot bases when the retaining arms are in the folded position.

9. The computer apparatus of claim 8, wherein
the void of the void and trunnion structure is an open notch for engaging with and disengaging from the trunnion.

10. The computer apparatus of claim 8, wherein
the retaining arms are sufficiently resilient to permit the void of the void and trunnion structure to snap over the trunnion for engaging with and disengaging from the trunnion.

11. The computer apparatus of claim 8, further comprising:
a first locking means between the first retaining arm and the first pivot base, and
a second locking means between the second retaining arm and the second pivot base,
the locking means preventing the disengagement of the retaining arms from the pivot bases when the retaining arms are in the unfolded position.

12. The computer apparatus of claim 11, wherein each locking means further comprises:
locking knob extending laterally from each pivot base; and
corresponding locking slot in each retaining arm which lock with the locking knob as the retaining arms pivot from the folded position to the unfolded position for preventing disengagement of retaining arm.

13. The computer apparatus of claim 12,
wherein each retaining arm further comprises a left leg and a right leg which straddle the pivot base; and
wherein each void and trunnion structure further comprises
a left void and trunnion between the pivot base and the left leg of each retaining arm, and
a right void and trunnion between the pivot base and the right leg of each retaining arm.

14. The computer apparatus of claim 13,
wherein the locking knob on each pivot base further comprises a left knob and a right knob; and
wherein the locking slot on each retaining arm further comprises
a left slot in the left leg for locking with the left knob, and
a right slot in the right leg for locking with the right knob.

15. The computer apparatus of claim 14, wherein
the left and right legs of the retaining arms are sufficiently resilient to permit the left void and trunnion and the right void and trunnion to snap into and out of engagement while in the folded position.

16. The computer apparatus of claim 15, further comprising
a left terminal ear on the end of the left knob, and
a right terminal ear on the end of the right knob for preventing lateral displacement of the resilient legs of the retaining arms while the retaining arms are in the unfolded position.

17. The computer apparatus of claim 1, further comprising:
a first fold detent means between the first pivot base and the first retaining arm for holding the first retaining arm in the folded position when the first retaining arm is pivoted about the first pivot axis close to the mother board, and
a second fold detent means between the second pivot base and the second retaining arm for holding the second retaining arm in the folded position when the second retaining arm is pivoted about the second pivot axis close to the mother board.

18. The computer apparatus of claim 17, wherein the folded position of the retaining arms is inward into the module site between the first and second ends of the electrical connector.

19. The computer apparatus of claim 1, wherein the pivotal engagement between the retaining arms and the pivot bases further provides:

an open receiving pivot position in which the retaining arms are displaced away from the module site beyond the unfolded position for providing access to the electrical connector as the add-on module is received.

20. The computer apparatus of claim 19, further comprising:

a first limit means on the first pivot bases for limiting the away displacement of the first retaining arm when in the open receiving position, and a second limit means on the second pivot bases for limiting the away displacement of the second retaining arm when in the open receiving position.

21. The computer apparatus of claim 19, further comprising:

a first receiving detent between the first pivot base and the first retaining arm for defining the away displacement of the open receiving position, and a second receiving detent between the second pivot base and the second retaining arm for defining the away displacement of the open receiving position.

22. The computer apparatus of claim 1, further comprising:

a first unfold detent means between the first pivot base and the first retaining arm for defining the unfolded position when the first retaining arm is pivoted about the first pivot axis away from the mother board, and a second unfold detent means between the second pivot base and the second retaining arm for defining the unfolded position when the second retaining arm is pivoted about the second pivot axis away from the mother board.

23. The computer apparatus of claim 22, wherein the unfolded position of the retaining arms is away from the mother board out of the module site.

* * * * *